US007385812B1

(12) United States Patent
Konshak et al.

(10) Patent No.: US 7,385,812 B1
(45) Date of Patent: Jun. 10, 2008

(54) METHOD AND APPARATUS FOR A THERMALLY CONDUCTIVE PACKAGING TECHNIQUE FOR COOLING ELECTRONIC SYSTEMS

(75) Inventors: Michael Vaughn Konshak, Louisville, CO (US); Michael L. Leonhardt, Longmont, CO (US)

(73) Assignee: Storage Technology Corporation, Louisville, CO (US)

( * ) Notice: Subject to any disclaimer, the term of this patent is extended or adjusted under 35 U.S.C. 154(b) by 129 days.

(21) Appl. No.: 11/346,915

(22) Filed: Feb. 3, 2006

(51) Int. Cl.
*H05K 7/20* (2006.01)

(52) U.S. Cl. ............... 361/690; 361/705; 361/708; 361/715

(58) Field of Classification Search ........... 361/690, 361/705, 708, 715
See application file for complete search history.

(56) References Cited

U.S. PATENT DOCUMENTS 3,264,526 A * 8/1966 Wiggerman ............ 361/732
5,153,815 A * 10/1992 Suzuki et al. ............ 361/718
6,393,853 B1 * 5/2002 Vukovic et al. ........... 62/259.2
6,587,339 B1 * 7/2003 Daniels et al. ............ 361/690
6,781,830 B2 * 8/2004 Barth et al. ............. 361/688
6,853,554 B2 * 2/2005 Bash et al. .............. 361/699
6,862,180 B2 * 3/2005 Sawyer et al. ........... 361/690
6,882,533 B2 * 4/2005 Bash et al. .............. 361/696

* cited by examiner

*Primary Examiner*—Gregory D Thompson
(74) *Attorney, Agent, or Firm*—Brooks Kushman P.C.

(57) ABSTRACT

A method and apparatus for a thermally conductive packaging technique for cooling electronic systems. A heat source is partially surrounded by a set of thermal transfer media. A set of thermal transfer shells partially surround the set of thermal transfer media. The heat source connection means are left exposed and utilized for connection to the electronic system. The heat source, the set of thermal transfer media configured to partially surround the heat source, and the thermal transfer shell partially surrounding the set of thermal transfer media form a thermal transfer module. Thermal transfer modules may be placed in thermally conductive cells. A set of thermal transfer sheets are placed in contact with both or either of the thermal transfer module and the thermally conductive cell, facilitating a heat exchange with an environment external to the thermal transfer module.

20 Claims, 8 Drawing Sheets

METHOD AND APPARATUS FOR A THERMALLY CONDUCTIVE PACKAGING TECHNIQUE FOR COOLING ELECTRONIC SYSTEMS

BACKGROUND OF THE INVENTION

1. Field of the Invention

The present invention relates generally to heat transfer in electronic units. In particular, the present invention relates to a method and apparatus for a thermally conductive packaging technique, which can be used for cooling electronic systems.

2. Description of the Related Art

Electronic components, such as tape drives, disk drives and microprocessors, operate within certain specified temperature ranges to perform efficiently. Excessive heat degrades their performances and life expectancy. The reliability of a storage device often decreases as the operational temperature increases. Such as a disk drive's data errors caused by thermal expansion and the resulting misalignment between the data transducer and the disk media. Further, higher operational temperatures also reduce the operational life of the storage device's other components. A storage device is any device that stores data. Examples of storage devices are one or more tape drives, optical devices, memory modules or disk drives.

To support advances in processors and software, the unit capacities of disk drives have increased from megabytes to gigabytes and read-write speeds have become faster. Generally, the spindle motor and actuator motor consume more power and generate more heat as speed increases. Additionally, the rotating storage disks generate more heat as the rotational speed increases. This situation results in higher operating temperatures within the drive housing. Where a single disk drive can not meet the needs of an application, multiple disk drives are employed. Therefore, hardware failures need to be minimized.

The fundamental principle behind the use of multiple disk drives in an array is that the array behaves in most respects like a single large, fast, reliable disk drive. The use of multiple drives allows the resulting storage subsystem to exceed the capacity, data integrity, and performance of the drives that make up the system, to one extent or another.

Electronic storage cabinets containing heat generating devices like disk drive arrays and servers are becoming increasingly denser, utilize high data transfer rates and need to restrict the size of apertures in the enclosures in order to attenuate radio frequency interference (RFI) and meet electromagnetic compatibility (EMC) requirements. Radio Frequency Interference is electromagnetic radiation which is emitted by electrical circuits carrying rapidly changing signals, as a by-product of their normal operation, which causes unwanted signals. Unwanted signals are interference or noise in a circuit induced by another source. These unwanted signals interrupt, obstruct, or otherwise degrade or limit the effective performance of the electronic device. Also, because of increases of clock speeds used in modern digital equipment, coupled with the lower signal levels these systems use, electromagnetic compatibility is more and more an issue.

For controlling heat in electronic devices, such as storage device arrays, typical electronic installations are historically designed for convection forced air cooling. In forced air cooling, air-moving devices draw ambient air into a housing through multiple inlet apertures strategically located to allow warm air to escape and cooler air to be drawn in. The forced air being blown through the electronic unit removes heat via convection. The typical forced air cooling of electronic units also includes channels, spaces, and gaps for the routing of the air around each of the electronic units being cooled. However, with the requirement for ever smaller electronic enclosure apertures for RFI and EMI control, effective convection cooling is increasingly difficult.

Cooling through conduction would help to eliminate the empty space, noise, airborne contamination, and vibration caused by forced air cooling. In other words, packing the disk drives densely so that conduction cooling could take place. However, the converse of this solution, for disk drives, is the problem that disk drives mounted in large arrays are susceptible to each other's rotational vibrations which can degrade the performance of adjacently mounted disk drives. Current packaging techniques try to physically isolate the drives from each other so that they are not mechanically connected. Unfortunately, this lessens the density of the array and the number of drives that may be packaged together. What is needed, currently, is a system that minimizes space, maximizes thermal transfer through conduction and, in the case of disk drives, limits vibrational transmission.

SUMMARY OF THE INVENTION

The present invention provides a method and apparatus for a thermally conductive packaging technique for cooling electronic systems. A heat source is partially surrounded by a set of thermal transfer media. A set of thermal transfer shells partially surround the set of thermal transfer media. The heat source connection means are left exposed and utilized for connection to the electronic system. The heat source, the set of thermal transfer media configured to partially surround the heat source, and the thermal transfer shell partially surrounding the set of thermal transfer media form a thermal transfer module. Thermal transfer modules may be placed in thermally conductive cells. Thermal transfer sheets are placed in contact with both or either of the thermal transfer module and the thermally conductive cell, facilitating a heat exchange with an environment external to the thermal transfer module.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
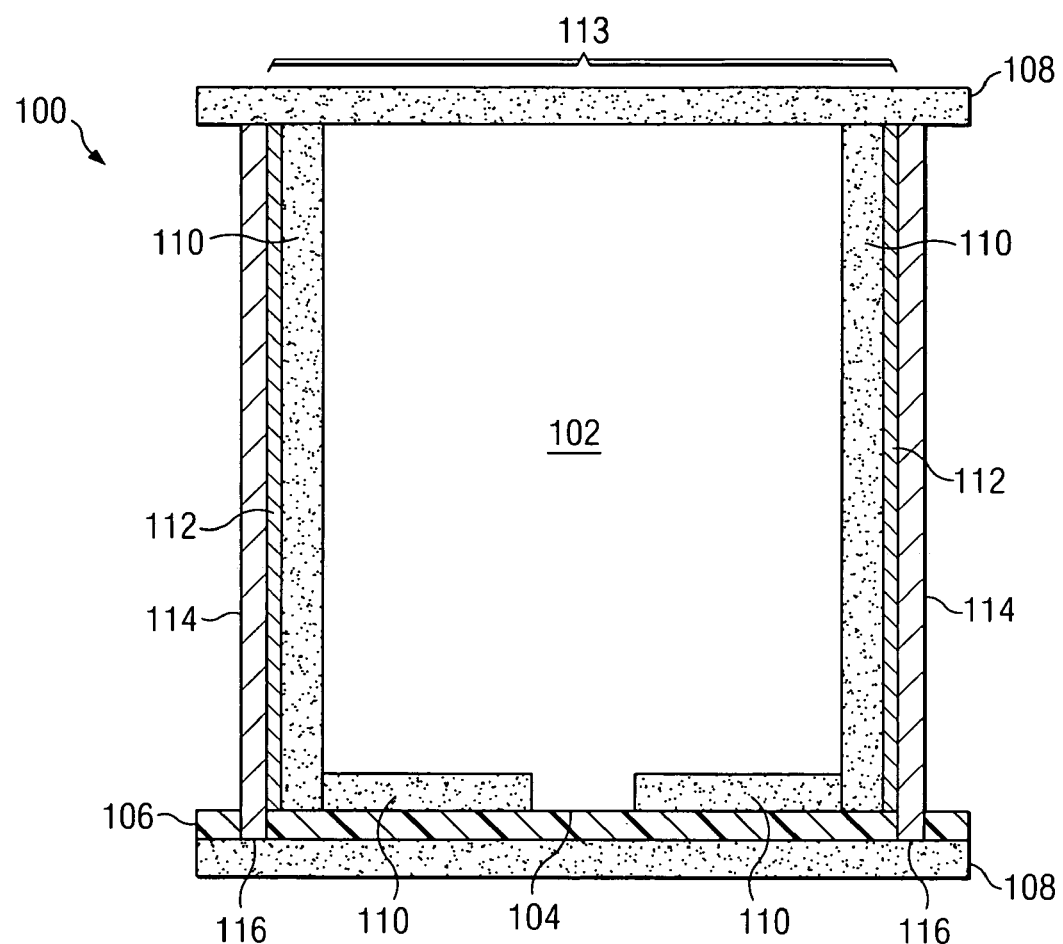
FIG. 1 depicts a block diagram of a cross section of an electronic system in accordance with an illustrative embodiment of the present invention.

With reference now to the figures and in particular with reference to FIG. 1, a block diagram of a cross section of electronic system 100 is depicted in accordance with an illustrative embodiment of the present invention. Electronic system 100, as depicted, illustrates a single unit in an array of such units. Heat source 102 is an electronic component or combination of electronic components which need protection from overheating, vibration or both overheating and vibration. A set of heat sources is one or more heat sources. Examples of a set of heat sources are a disk drive, a number of disk drives, a power supply, a tape drive, a semiconductor device or a circuit board containing one or more semiconductor devices. Heat source 102 has connector means 104, which operably connect into circuit board 106. An operable connection is a connection which enables the heat source to function. A connector means is any means which allows an operable connection to the electronic system. Some examples of other types of connection means are wiring harnesses, wiring cable, optical links, inductive links, capacitive links and the like. Circuit board 106 contacts thermal transfer sheet 108. Contact is a connection between two conductors that permits a flow of heat. In this illustrative example, heat source 102 is surrounded on four of its six sides with a set of thermal transfer media 110. Thermal transfer media is a non-insulating solid, including metal and plastics, or elastomeric compound, including water and refrigerants that is thermally conductive. A set of thermal transfer media is one or more thermal transfer media. Heat source 102 with set of thermal transfer media 110, are in turn covered on the same four sides by thermal transfer shell 112. A thermal transfer shell is a thermally conductive sheet or skin that establishes the shape of a removable module which facilitates assembly, both at the module level as well as during installation of the module, and becomes part of the overall thermal path of the assembly. A heat source contained in a set of thermal transfer media, partially surrounded by a thermal transfer shell, is a thermal transfer module. A set of thermal transfer modules is one or more thermal transfer modules. In this example, thermal transfer module 113 is heat source 102, partially surrounded by set of thermal transfer media 110, and partially surrounded by thermal transfer shell 112. Thermal transfer module 113 leaves the top surface and connector means 104 of heat source 102 exposed. In another illustrative embodiment of the present invention, the heat source is surrounded on all sides by a set of thermal transfer media with only the connector means exposed. The definition of partially surrounded encompasses the range including: a surface is contacted, and a heat source is totally surrounded. In this illustrative embodiment of the present invention, thermal transfer shell 112 is formed from a metal or injection molded plastic. In another illustrative embodiment of the present invention, the thermal transfer shell is an integral part of the thermal transfer media. In other words, the thermal transfer shell is a constituent element of the thermal transfer media. Thermal transfer shell 112 provides a firm, but compressible exterior surface protecting set of thermal transfer media 110 partially surrounding heat source 102.

In this example, thermal transfer module 113 contains heat source 102, set of thermal transfer media 110, and thermal transfer shell 112. Thermal transfer module 113 is shown inserted into thermally conductive cell 114. Thermally conductive cell 114 as depicted is one of an array of thermally conductive cells. A set of thermally conductive cells is one or more thermally conductive cells. Thermally conductive cell 114 are cells constructed of rigid, highly conductive sheets of metal or other material and, in this example, are open ended. High thermal conductivity, is a property of an engineering material, as when compared to other similar materials used in manufacturing components, exhibits a higher rate of thermal transmissibility, which makes such a material more suitable than others within an appropriate application. In this illustrative example, bottom edge 116 of thermally conductive cell 114 contacts thermal transfer sheet 108.

Thermal transfer sheets 108 and set of thermal transfer media 110 may be constructed of the same highly conductive, conforming material. Thermal transfer sheets 108 and set of thermal transfer media 110, in this illustrative embodiment of the present invention are a pad like material and can consist of materials commercially available, such as products from 3M™ or Dow Corning. The 3M™ Company Corporate Headquarters is located in Maplewood, Minn. The Dow Corning Corporate Center is located in Midland, Mich. Dow Corning is equally owned by The Dow Chemical Company and Corning, Incorporated. In other embodiments of the present invention, thermal transfer media is "formed-in-place" by, for example, injecting the thermal transfer media into the space between the heat source and the thermally conductive cell. In another illustrative embodiment of the present invention, the thermal transfer media is pre-formed to conform to the physical characteristics of the heat source and other electronic system components. Preformed means that the shape of the media is constructed to conform to the components of the electronic system. Depending upon the particular thermal transfer media material characteristics, a separate thermal transfer shell may or may not be employed. For heat sources that are sensitive to vibration, such as disk drives, the selection of thermal transfer media will be influenced by the media's vibrational damping capabilities as well as the media's thermal transfer properties. Thermal transfer sheets and thermal transfer pads are types of thermal transfer media. Other candidate heat transfer materials can include: polyolefin, epoxy, low molecular weight polyesters, filled acrylics, or the like.

Heat source 102, set of thermal transfer media 110, thermal transfer shell 112, and thermal transfer sheet 108 are shown with no clearances between them. No clearance means, no intervening space or distance, allowing movement, between the components. Thermal transfer sheet 108 and set of thermal transfer media 110 may be made of a silicone based polymer that will conform to physical irregularities of other system components. Thus, reducing or eliminating any air gap between the components that the thermal transfer sheets 108 separate, thereby providing good thermal transfer properties, while reducing vibrational transmissibility.

In viewing electronic system 100 as depicted in FIG. 1, the heat generated by heat source 102 has several paths in which to flow in accordance with an illustrative embodiment of the present invention. In these examples, the heat may flow through set of thermal transfer media 110, through thermal transfer shell 112, through thermally conductive cell 114, through thermal transfer sheet 108, and out of electronic system 100. Another heat path according to an illustrative embodiment of the present invention is directly from heat source 102 to thermal transfer sheet 108 and out of the electronic system. Many such efficient heat paths exist in accordance with an illustrative embodiment of the present invention. Of course other heat paths may be employed depending on the configuration of electronic system 100 and the location of heat source 102 within this system.

Figure 2:
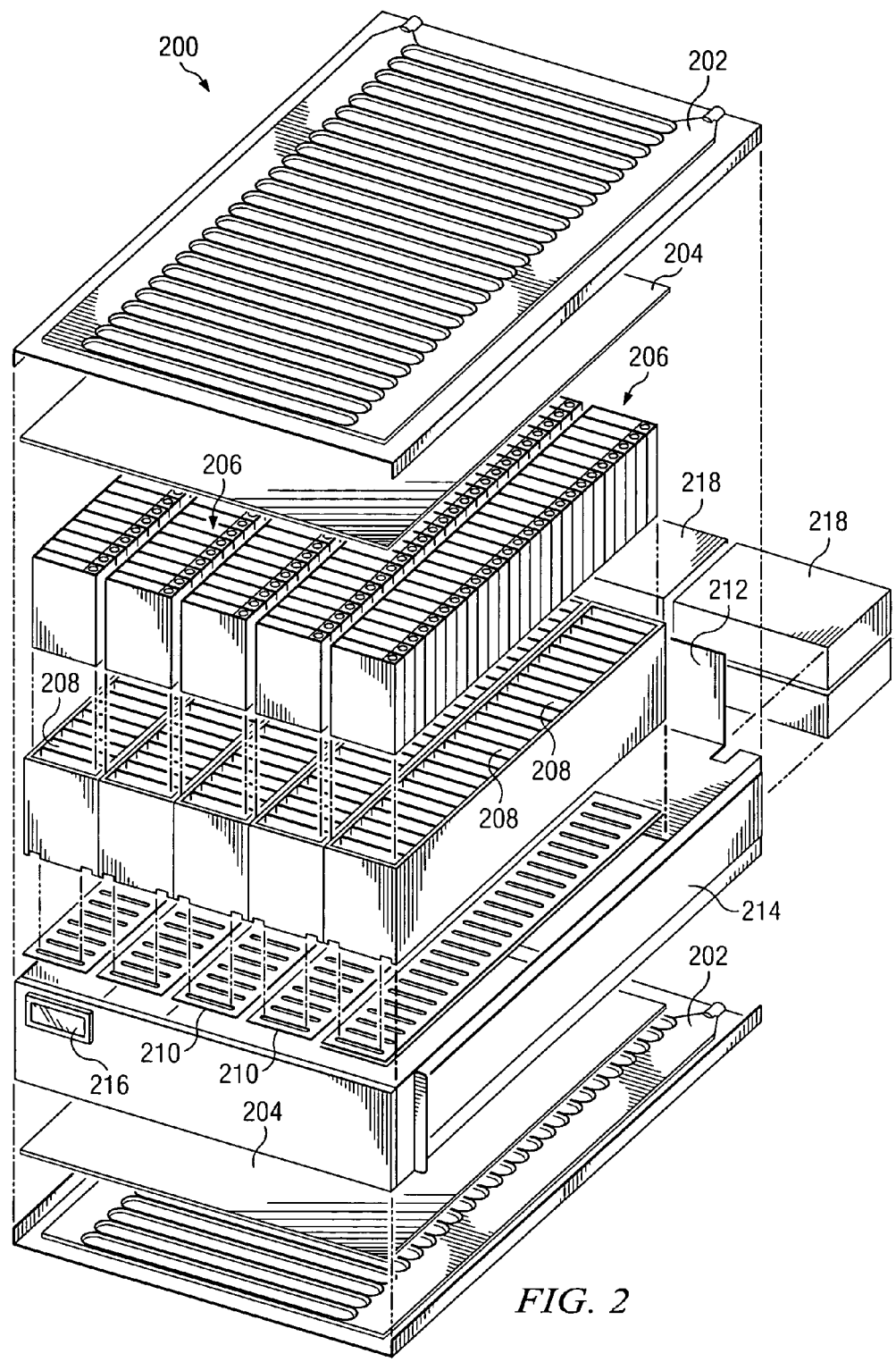
FIG. 2 depicts an exploded view of a data storage array in accordance with an illustrative embodiment of the present invention.

With reference now to FIG. 2, an exploded view of a data storage array is shown in accordance with an illustrative embodiment of the present invention. Data storage array 200 is an example of an array of electronic system units, such as electronic system 100 in FIG. 1. Data storage array 200, an illustrative embodiment of the present invention, implements an environment for data storage units that is more temperature stabilized and equalized across the set of heat sources than current systems. Temperature cycling and hot spots in the electronic system are reduced. In the depicted example, data storage array 200 employs a heat transfer architecture that includes heat exchange units 202. A heat exchange unit is a device built for efficient heat transfer from one fluid to another, whether the fluids are separated by a solid wall so that they never mix, or the fluids are directly contacted. Of course, many types of heat exchange units may be used in accordance with an illustrative embodiment of the present invention. Examples of heat exchange units that also may be used include a refrigerated or a water-cooled chiller system, a conductive cold-wall cooling method or a forced air convection system. A set of heat exchange units may be one or more heat exchange units. Set of thermal transfer sheets 204 are placed in contact with heat exchange unit 202 to more readily transfer heat to heat exchange unit 202. Set of thermal transfer sheets can include one or more thermal transfer sheets.

In accordance with an illustrative embodiment of the present invention, disk drives are the heat sources contained in set of thermal transfer modules 206. Set of thermal transfer modules 206 are fitted into a set of conductive cells 208, which are rigid and thermally conductive. Various materials may be used to form conductive cells 208. For example, thermally conductive cells 208 may be constructed of highly conductive sheets or castings of metal such as aluminum or may be constructed of a thermally conductive injection molded plastic, such as made by Cool Polymers. Cool Polymers, Incorporated is headquartered in Warwick, R.I. Rigid, thermally conductive cells 208 are constructed of such dimensions as to provide an interference fit with set of thermal transfer modules 206. An interference fit is a fit having limits in size so prescribed as to always have interference between the parts are when the parts are assembled. In other words, a tight fit providing good contact between set of thermal transfer modules 206 and rigid, thermally conductive cells 208 is achieved. An interference fit between two objects is one example of contact. Another example of contact is a touching of surfaces.

Using a connection means, not shown in this diagram, set of thermal transfer modules 206 plug into daughter circuit board 210. Set of thermal transfer modules 206 contain a heat source, in this example, a disk drive, with the connection means exposed. A circuit board is an insulated board on which interconnected circuits and components are mounted. A daughter circuit board is a circuit board that plugs into a mother circuit board to augment its capabilities. In the depicted example, daughter circuit board 210 is an intermediate circuit board that plugs into central back plane 212 and also plugs into a motherboard which is not depicted in this figure. Central back plane 212 is a circuit board that connects the daughter circuit boards together. All of these components are housed in data storage array housing 214. A housing is that which covers, protects, or supports the components contained within it. A water-tight housing is a sealed housing made to be secure against leakage. A sealed housing has no apertures in the enclosure, and therefore attenuates radio frequency interference (RFI) and electromagnetic compatibility (EMC) issues.

Data storage array 200 also has the feature of damping mechanical vibration such as the rotational vibration of disk drives. Mechanical vibrations may be caused by sources both internal and external to the individual heat source. In the disk drive array example, mechanical vibration may be caused by the rotational motion of the disk media and by the rotational acceleration and deceleration of the head actuators. In other words, the vibrational transmissibility of the system is damped by the elastomeric properties of set of thermal transfer media 110, thus heat source 102 has the feature of mechanical isolation in electronic system 100.

Figure 3:
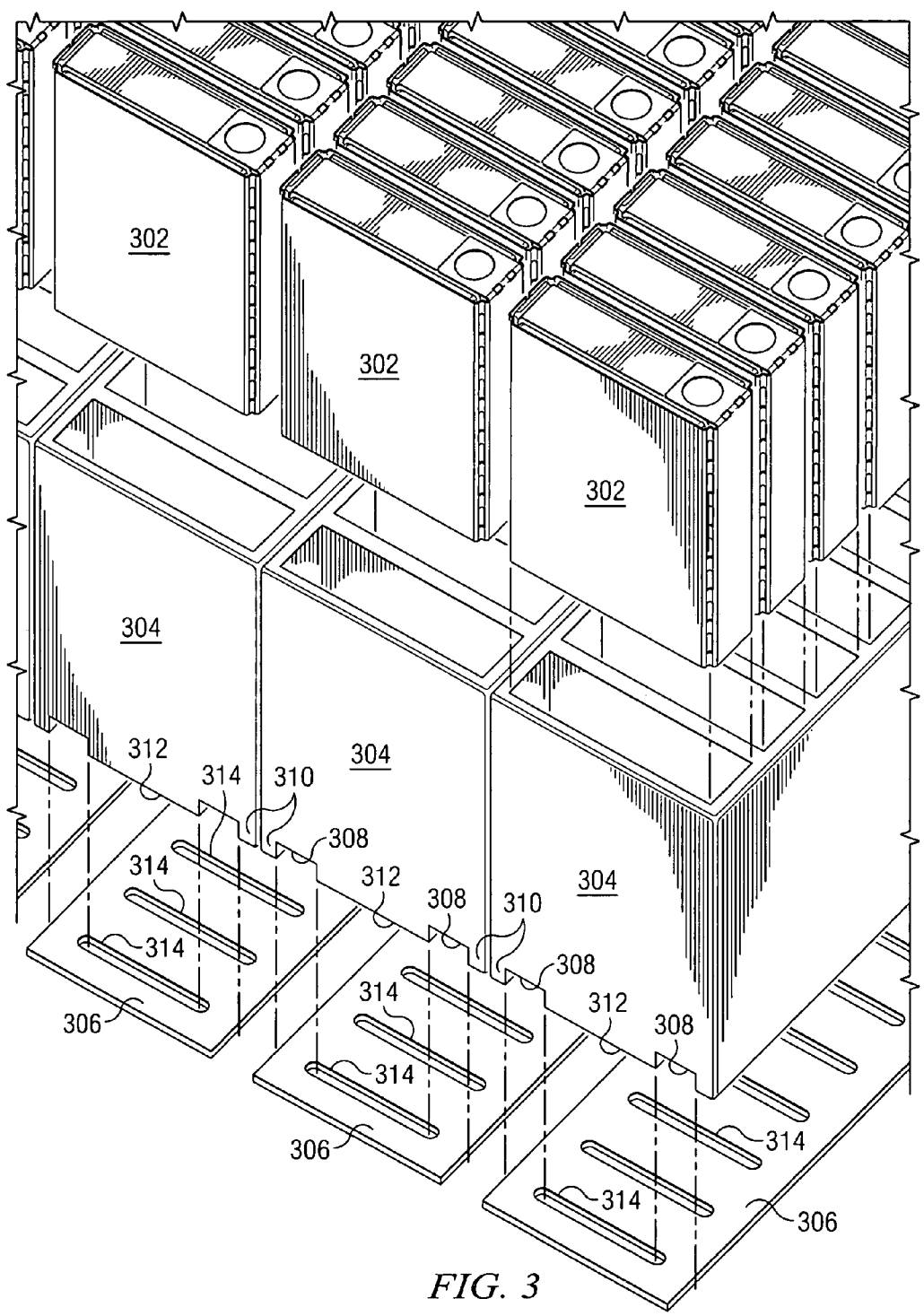
FIG. 3 depicts a detail of an exploded view of a thermally conductive cell area of a data storage array in accordance with an illustrative embodiment of the present invention.

Turning now to FIG. 3, a detail of an exploded view of a thermally conductive cell area of a data storage array is depicted in accordance with an illustrative embodiment of the present invention. The top and front of set of thermal transfer modules 302 are depicted. Set of thermal transfer modules 302 fit into rigid, thermally conductive cells 304 tightly, to form a good thermal contact between set of thermal transfer modules 302 and thermally conductive cells 304. The connection means of set of thermal transfer modules 302 plug into daughter circuit board 306.

The bottom of rigid thermally conductive cells 304 show two cut out areas 308 that contact daughter circuit board 306. The remaining areas on the bottom of thermally conductive cells 304 form tabs 310 and 312 that protrude through daughter circuit board 306 and contact a set of thermal transfer sheets. The area on daughter circuit board 306 that allows a protrusion is called a slot. A set of thermal transfer sheets is one or more thermal transfer sheets. Slots 314, depicted in daughter circuit board 306, receive center tab 312. Tabs 310 fit around the sides of daughter circuit board 306 to contact thermal transfer sheet, such as depicted by element 108 of FIG. 1. The heat from set of thermal transfer modules 302 can be conducted to the thermal transfer sheet directly through tabs 310 and 312.

Figure 4:
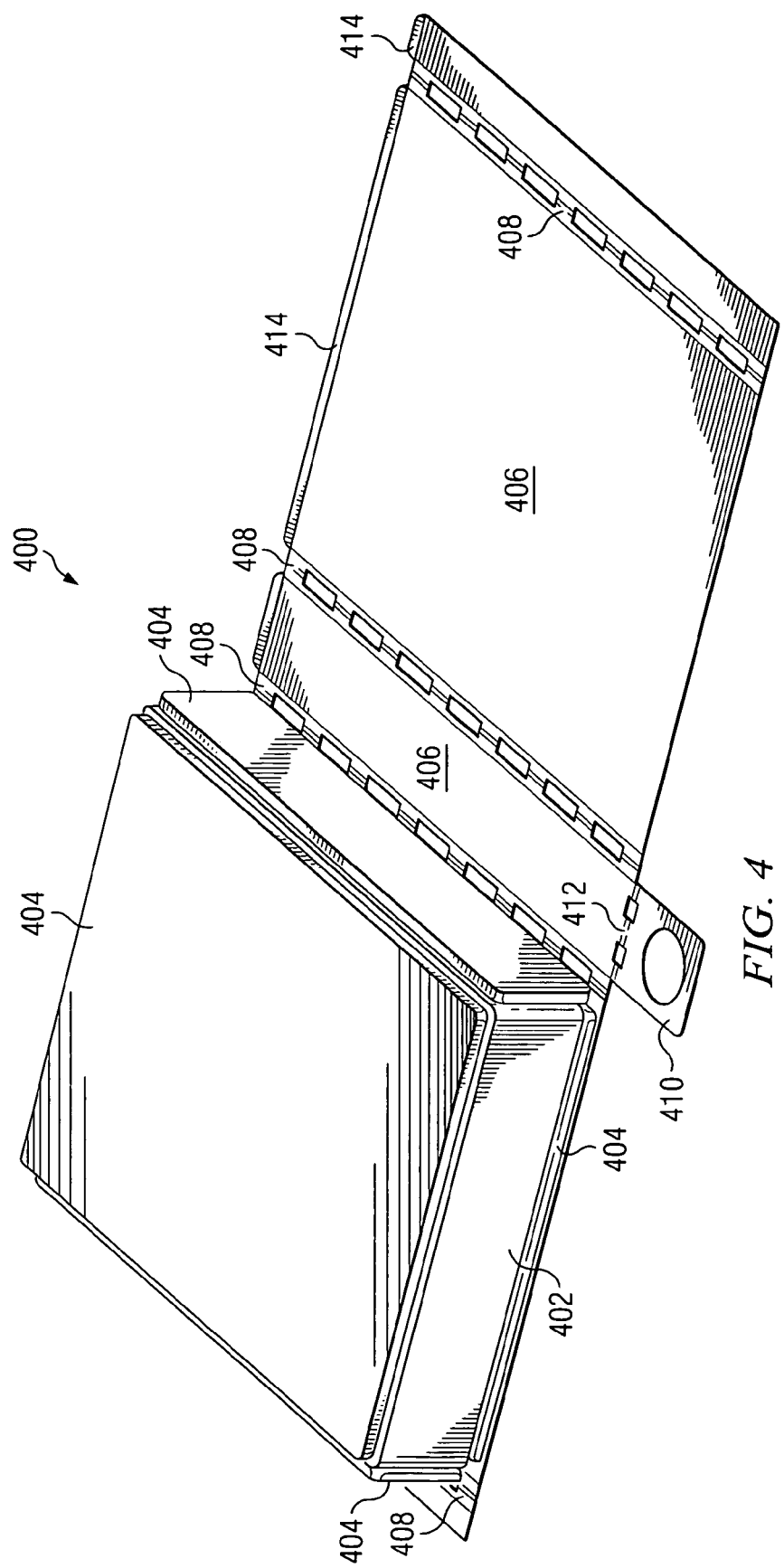
FIG. 4 depicts an unfolded top view of a thermal transfer module in accordance with an illustrative embodiment of the present invention.

Turning now to FIG. 4, an unfolded top view of thermal transfer module 400 is shown in accordance with an illustrative embodiment of the present invention. Disk drive 402 is shown as an example of heat source 102 of FIG. 1. Four sides of disk drive 402 have set of thermal transfer pads 404 affixed to disk drive 402, in this example. Thermal transfer pads 404 are an example of thermal transfer media. Pads are thin, cushion like masses of thermally conductive, elastic material. There are thermal transfer pads 404 for each of the four surfaces of disk drive 402 that are encircled by thermal transfer shell 406. In this example, the thermal transfer shell is a discreet shell. The disk drive is partially surrounded by set of thermal transfer pads 404.

Disk drive top plate 402 and a disk drive connection means (not shown) do not have set of thermal transfer pads 404 or thermal transfer shell 406 covering their surfaces and are therefore exposed. Set of thermal transfer pads 404 may be attached to the disk drive as shown or set of thermal transfer pads 404 may be attached to thermal transfer shell 406, in accordance with an illustrative embodiment of the present invention. The edges of set of thermal transfer pads 404 have a radius.

Thermal transfer shell 406 provides a hardened exterior surface of thermal transfer module 400 for handling, support and protection of the thermal transfer media. A set of thermal transfer shells is one or more thermal transfer shells. Thermal transfer module 400 is compressible, so that an interference fit between thermal transfer module 400 and other system components can be obtained. Compressible hinges 408 may be stamped into a thermal transfer shell 406 during manufacture. Compressible hinge means a hinge that will deform under pressure. Compressible hinges 408 allow a single piece thermal transfer shell 406 to fit around set of thermal transfer pads 404. Compressible hinges 408 may be formed in the same stamping operation that forms thermal transfer shell 406 by perforating and thinning the material of thermal transfer shell 406 at compressible hinge 408 locations. Thermal transfer shell 406 wraps around set of thermal transfer pads 404, bending at compressible hinges 408. Thermal transfer shell 406 forms an outer surface of thermal transfer module 400. Set of thermal transfer pads 404 radius allow compressible hinges 408 to bend inward. Compressible hinges 408 aid in implementing an interference fit between thermal transfer module 400 and a thermally conductive cell.

Thermal transfer shell 406 has pull tab 410 that aids in removing thermal transfer module 400. A pull tab is a flap used to facilitate handling. Pull tab 410 is connected to thermal transfer shell 406 by compressible hinge 412. Thermal transfer shell 406 may have a bend in its bottom edge 414. The bend in bottom edge 414 aids in the installation of thermal transfer module 400 into the rigid, thermally conductive cell. The act of pushing thermal transfer module 400 into an interference fit in a thermally conductive cell is aided by an angle on bottom edge 414, the radius on the edge of set of thermal transfer pads 404, and compressible hinges 408. If the thermal transfer module is removed, pull tab 410 will help in the process.

Figure 5A:
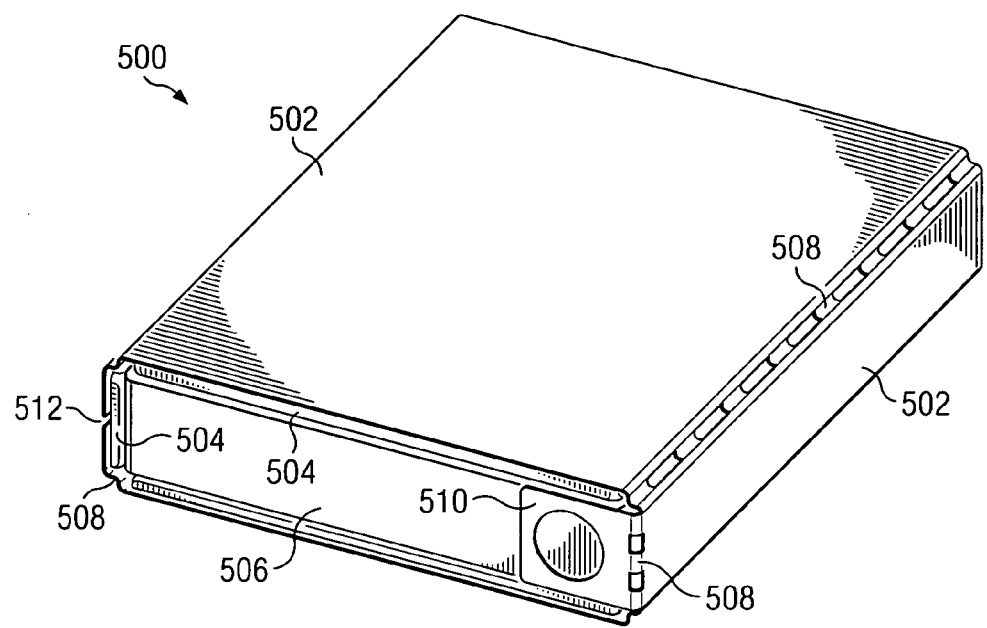
FIG. 5A depicts a closed view of the top and side of a thermal transfer module in accordance with an illustrative embodiment of the present invention.

Turning now to FIG. 5A, a closed view of the top and side of thermal transfer module 500 is depicted, in accordance with an illustrative embodiment of the present invention. In this example, thermal transfer shell 502 is shown wrapped around set of thermal transfer pads 504 which are affixed to four sides of a disk drive. In other words, thermal transfer shell 502, with set of thermal transfer pads 504 contacting the disk drive, surrounds, on four sides, the disk drive. The bottom connector means of the disk drive (not shown) and the top surface of the disk drive 506 are not wrapped in thermal pads 504 and thermal transfer shell 502. The term wrapping indicates that thermal shell 502 is of one piece of material with hinges in the corners that fit around set of thermal transfer pads 504. Of course, those of ordinary skill in the art can implement other ways of partially surrounding set of thermal transfer pads 504 with thermal transfer shell 502, such as forming thermal transfer shell 502 out of separate pieces of thermally conductive material. Or in an illustrative embodiment of the present invention, the thermal transfer shell is integral to the thermal transfer media.

The edge radius of set of thermal transfer pads 504 is depicted on the three visible sides. Compressible hinges 508, as shown, are rounded concavely. Pull tab 510 is shown in a closed position. Thermal transfer shell 502 wraps around thermal transfer module 500, with the edges of the shell nearly meeting at gap 512. Compressible gap means a break or opening in a structure, in which the break or opening will be made smaller under pressure. Compressible gap 512, along with compressible hinges 508, enable thermal transfer module 500 to compress upon insertion into a thermally conductive cell. This compression is used to provide for the interference fit between thermal transfer shell 502 and a thermally conductive cell.

Figure 5B:
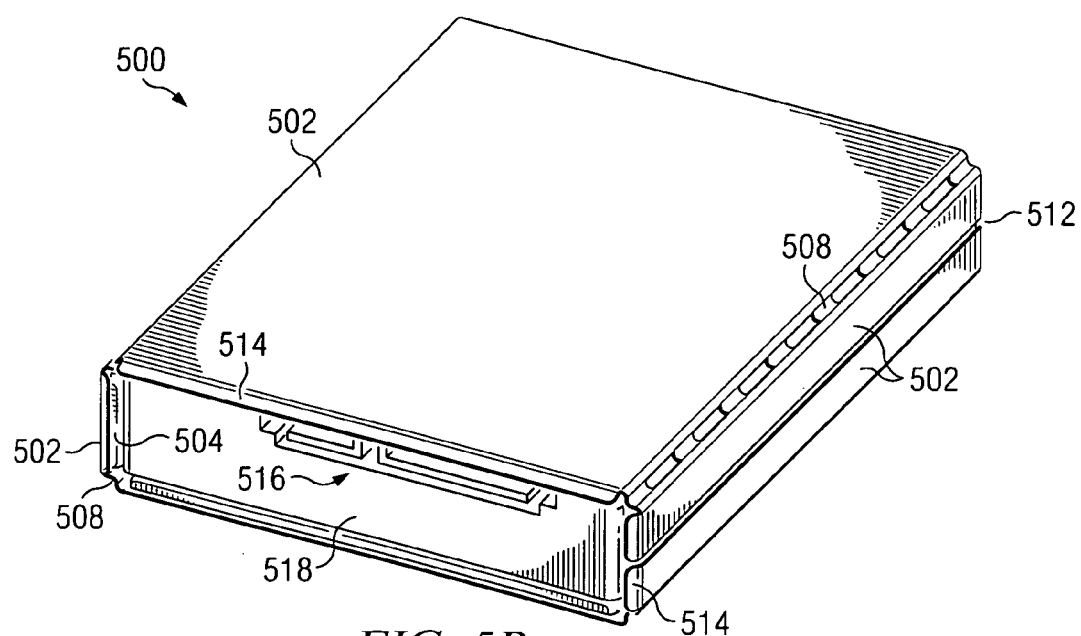
FIG. 5B depicts a closed view of the bottom and side of a thermal transfer module in accordance with an illustrative embodiment of the present invention.

Turning now to FIG. 5B, a closed view of the bottom side of thermal transfer module 500 is depicted, in accordance with an illustrative embodiment of the present invention. Thermal transfer shell 502, compressible hinges 508, and compressible gap 512, are visible from this angle. Also, a 45 degree bend in thermal transfer shell edge 514 is visible in this figure. Those of ordinary skill in the art will realize that any or no bend that furthers the insertion of thermal transfer module 500 into a thermally conductive cell may be used in accordance with an illustrative embodiment of the present invention. Edges 514 are the leading edges for the insertion of thermal transfer module 500 into a thermally conductive cell. Connector means 516 plug into the daughterboard as depicted in FIG. 3. Connecting surface 518 is not covered by thermal transfer shell 502, but left open so that connector means 516 will be exposed and can be connected to an electronic system as shown in FIG. 2.

Figure 5C:
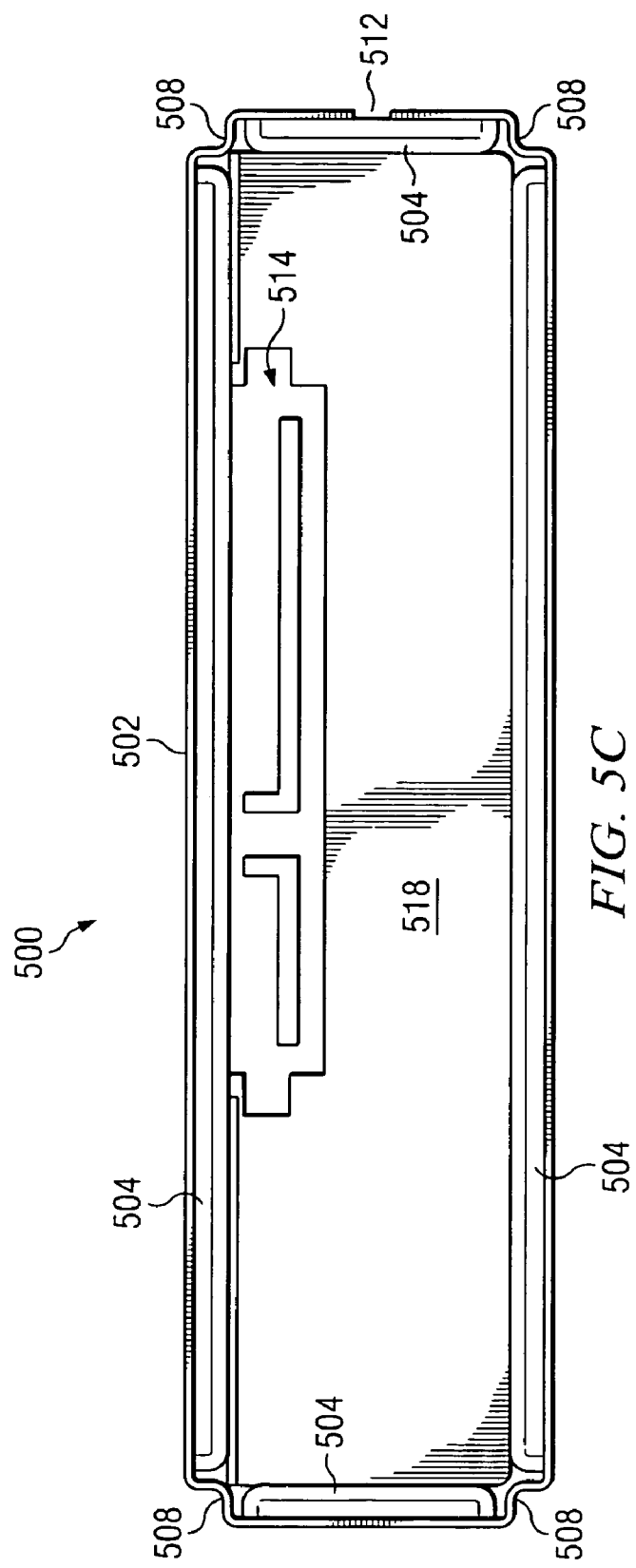
FIG. 5C depicts a bottom view of a thermal transfer module in accordance with an illustrative embodiment of the present invention.

Turning now to FIG. 5C, a bottom view of thermal transfer module 500 is depicted, in accordance with an illustrative embodiment of the present invention. Thermal transfer shell 502 is shown without a bended edge for clarity. The edge radius of set of thermal transfer pads 504 is shown. This radius aids in the compression of thermal transfer module 500, allowing compressible hinges 508 to compress inward. Compressible gap 512 is also allowed to compress during the insertion process. These features promote an interference fit of the thermal transfer module 500 into a thermally conductive cell. The thermal module is open on the bottom leaving connector means 514 exposed so that an operative connection to the electronic system can be achieved.

Figure 6:
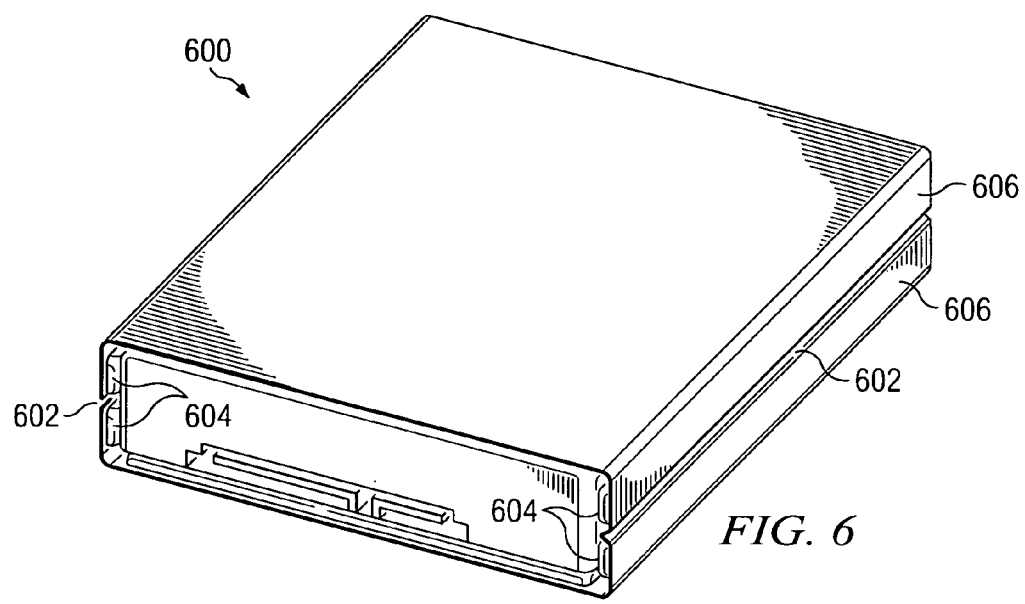
FIG. 6 depicts another configuration of a thermal transfer module in accordance with an illustrative embodiment of the present invention.

Turning now to FIG. 6, another configuration of a thermal transfer module is depicted in accordance with an illustrative embodiment of the present invention. Thermal transfer module 600 is configured with compressible gaps 602 on either side of thermal transfer module 600. Set of thermal transfer pads 604 show a compressible gap as well as thermal transfer shell 606 on both sides of thermal transfer module 600.

Figure 7:
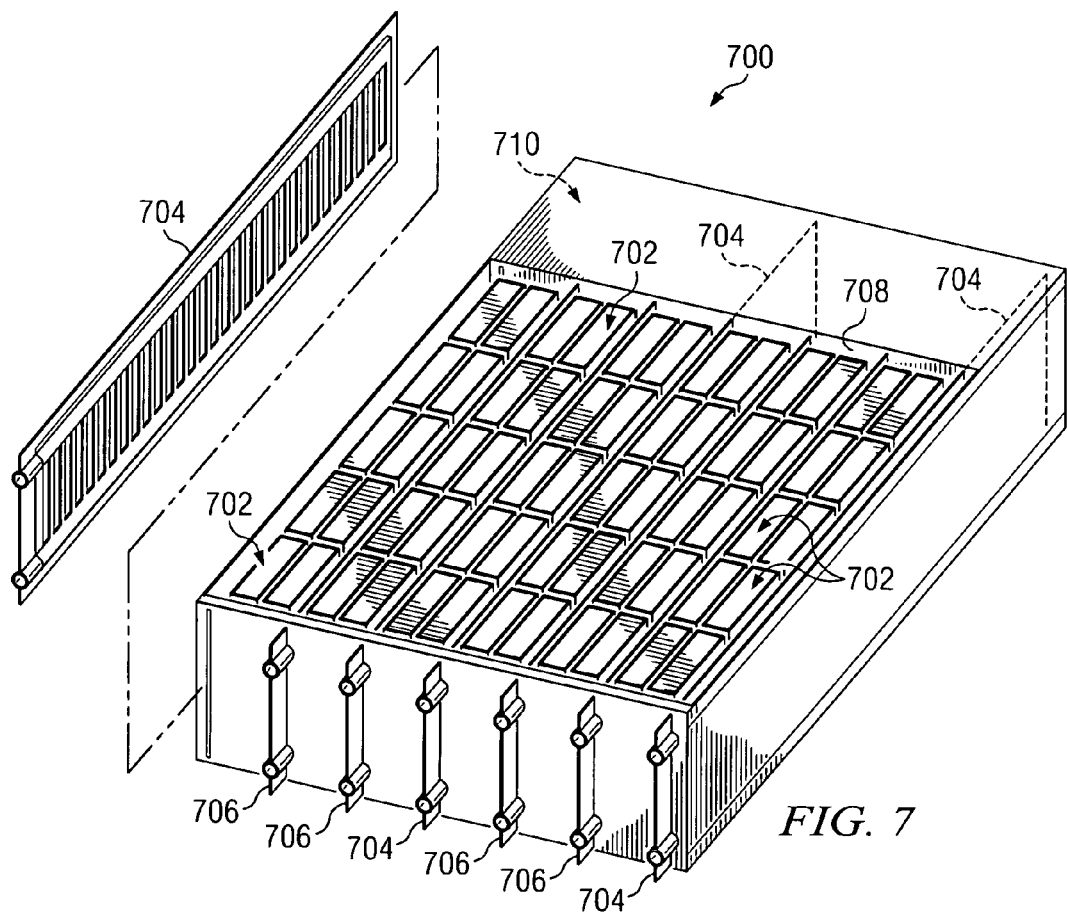
FIG. 7 illustrates another embodiment of an electronic system such as the system in element 100 of FIG. 1 in accordance with an illustrative embodiment of the present invention.

With reference now to FIG. 7, a partially exploded view of a data storage array with the top removed is depicted in accordance with an illustrative embodiment of the present invention. FIG. 7 illustrates another embodiment of an electronic system such as the system in element 100 of FIG. 1. Data storage array 700 is shown with the top housing and top thermal transfer sheet removed to reveal set of thermal transfer modules 702. Set of thermal transfer modules 702 are paired together in rows. The rows are separated by heat exchange units 704 and 706. Set of thermal transfer modules 702 are in contact with each other, and with a set of thermal transfer sheets. Not shown in this figure, a set of thermal transfer sheets are placed between set of thermal transfer modules 702 and the top of data storage array 700's housing. This set of thermal transfer sheets are in contact with heat exchange units 704 and 706.

Heat exchange units 706 extend between the pair rows of set of thermal transfer modules 702 to back plate 708. Heat exchange units 704 extend pass central back plane 708 to provide cooling to input/output units, power supplies and additional electronics 710. Longer length heat exchange unit 704 is illustrated apart from data storage array 700. A set of heat exchange units may be made of individual units of differing size and configuration. The configuration of an illustrative embodiment of the present invention, 700 provides for more cooling of set of thermal transfer modules 702.

Figure 8:
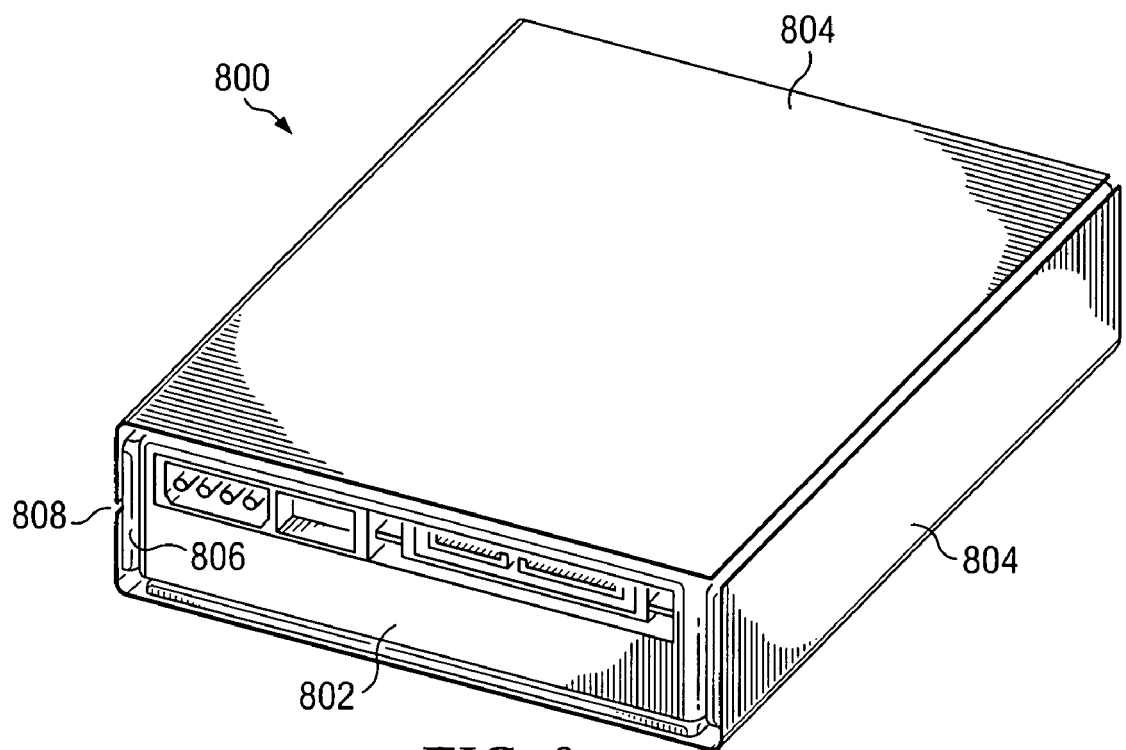
FIG. 8 depicts a detail of the back of a thermal transfer module for a disk drive as illustrated in FIG. 7 in accordance with an illustrative embodiment of the present invention.

Turning now to FIG. 8, a detail of the bottom of thermal transfer module 800 for a disk drive, as illustrated in element 702 of FIG. 7, is shown, in accordance with an illustrative embodiment of the present invention. The thermal transfer module is an example of an electronic system as depicted in element 113 of FIG. 1. Thermal transfer module 800 is shown from the bottom. Connection means 802, of the disk drive, shows the typical connector means for a disk drive as illustrated. These connector means include power, data and control connections. Thermal shell 804, in accordance with an illustrative embodiment of the present invention, encircles four sides of the disk drive. Neither connection means 802 nor the front plate (not shown) is covered with set of thermal transfer pads 806 or thermal transfer shell 804. Thermal transfer shell 804 is wrapped around the disk drive leaving compressible gap 808. Compressible gap 808 allows for compression of thermal transfer shell 804 during installation of thermal transfer shell 804 into the thermally conductive cells (not shown). Those of ordinary skill in the art, will appreciate that set of thermal transfer pads 806 and thermal transfer shell 804 may vary depending on the implementation.

Thus, the aspects of the present invention provide a method and apparatus for a thermally conductive packaging technique for cooling electronic systems. A heat source is placed in a set of thermal transfer pads partially surrounding the heat source, leaving the connection means of the heat source exposed, and an outer thermal transfer shell, that partially surrounds the set of thermal transfer pads. The heat source is connected to the electronic system, using the heat source connection means. The heat source, the set of thermal transfer pads configured to partially surround the heat source, and the thermal transfer shell partially surrounding the set of thermal transfer pads form a thermal transfer module. Thermal transfer modules may be placed in thermally conductive cells. A set of thermal transfer sheets are placed in contact with both or either of the thermal transfer module and the thermally conductive cell, facilitating a heat exchange with an environment external to the thermal transfer module.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. An electronic system apparatus, containing a set of heat sources within an electronic system apparatus housing, the electronic system apparatus comprising:

a set of thermal transfer media, wherein a first side of the thermal transfer media partially surrounds the set of heat sources;

a connection means of the set of heat sources; whereby the connection means of the set of heat sources is operably connected to a connection means of the electronic system apparatus;

a set of thermal transfer shells partially surrounding a second opposite side of the set of thermal transfer media, wherein the set of heat sources, the set of thermal transfer media and the set of thermal transfer shells form a set of thermal transfer modules wherein the thermal transfer media is positioned between the set of heat sources and the set of thermal transfer shells; and a set of heat exchange units, whereby the heat exchange units are in contact with the set of thermal transfer modules.

2. The electronic system apparatus of claim 1, wherein the set of heat transfer modules are in contact with a set of heat transfer sheets, and wherein the set of heat transfer sheets are in contact with the set of heat exchange units.

3. The electronic system apparatus of claim 1, wherein the set of thermal transfer shells are an integral part of the set of thermal transfer media.

4. The electronic system apparatus of claim 1, wherein the set of thermal transfer shells includes one or more of the following features: a compressible hinge, a pull tab, or a compressible gap.

5. The electronic system apparatus of claim 1, wherein the set of thermal transfer media comprises one or more of the following, a set of pads, a compliant thermally conductive material, a thermally conductive material that is formed in place or a pre-formed thermally conductive material.

6. The electronic system apparatus of claim 5, wherein the thermally conductive material utilizes one or more of polyolefin, epoxy, low molecular weight polyesters, filled acrylics.

7. The electronic system apparatus of claim 1, wherein the electronic system housing is water-tight.

8. An electronic system apparatus containing a set of heat sources within an electronic system apparatus housing, the electronic system apparatus comprising:

a set of thermal transfer media wherein the thermal transfer media partially surrounds the set of heat sources:

a connection means of the set of heat sources; whereby the connection means of the set of heat sources is operably connected to a connection means of the electronic system apparatus;

a set of thermal transfer shells partially surrounding the set of thermal transfer media, wherein the set of heat sources the set of thermal transfer media and the set of thermal transfer shells form a set of thermal transfer modules;

a set of heat exchange units whereby the heat exchange units are in contact with the set of thermal transfer modules; and wherein, without clearances there between, the set of thermal transfer modules are placed in a set of thermally conductive cells; and wherein, without clearances there between, the heat exchange units are in contact with the set of heat transfer modules.

9. The electronic system apparatus of claim 8, wherein the connection means of the electronic system is a circuit board, and wherein the circuit board is slotted to allow the set of thermally conductive cells to contact both the circuit board and a set of thermal transfer sheets.

10. The electronic system apparatus of claim 9, wherein the set of thermal transfer media and the set of thermal transfer sheets are made of a thermally conductive, silicone based polymer.

11. A method of constructing an electronic system, containing a set of heat sources, the method comprising:

partially surrounding the set of heat sources with a set of thermal transfer media, leaving a connection means of the set of heat sources exposed, wherein the connection means of the set of heat sources is operably connected to a connection means of the electronic system;

partially surrounding the set of thermal transfer media with a set of thermal transfer shells such that the heat sources, the set of thermal transfer media and the set of thermal transfer shells combine to form separate unitary structures, wherein the set of heat sources, the set of thermal transfer media and the set of thermal transfer shells form a set of thermal transfer modules, each set of thermal transfer modules being individually removable from an electronic system housing; and placing a set of heat exchange units in contact with the set of thermal transfer modules, whereby the set of heat exchange units and the set of thermal transfer modules are contained in the electronic system housing.

12. The method of claim 11, wherein, without clearances there between, the set of thermal transfer modules are placed in a set of thermally conductive cells; and wherein, without clearances there between, the heat exchange units are in contact with the set of heat transfer modules.

13. The method of claim 11, wherein the set of heat transfer modules are in contact with a set of heat transfer sheets, and wherein the set of heat transfer sheets are in contact with the set of heat exchange units.

14. The method of claim 12, wherein the connection means of the electronic system is a circuit board, and wherein the circuit board is slotted to allow the set of thermally conductive cells to contact both the circuit board and the set of thermal transfer sheets.

15. The method of claim 14, wherein the set of thermal transfer media and the set of thermal transfer sheets are made of a thermally conductive, silicone based polymer.

16. The method of claim 11, wherein the set of thermal transfer shells are an integral part of the set of thermal transfer media.

17. The method of claim 11, wherein the set of thermal transfer shells includes one or more of the following features: a compressible hinge, a pull tab, or a compressible gap.

18. The method of claim 11, wherein the set of thermal transfer media comprises one or more of the following: a set of pads, a compliant thermally conductive material, a thermally conductive material that is formed-in-place, or a pre-formed thermally conductive material.

19. The method of claim 18, wherein the thermally conductive material utilizes one or more of the polyolefin, epoxy, low molecular weight polyesters, or filled acrylics materials.

20. The method of claim 11, wherein the electronic system housing is water-tight.

\* \* \* \* \*